(12) United States Patent
Long

(10) Patent No.: US 11,239,283 B2
(45) Date of Patent: Feb. 1, 2022

(54) PIXEL STRUCTURE, DISPLAY SUBSTRATE AND DISPLAY DEVICE

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 16/649,942

(22) PCT Filed: Oct. 14, 2019

(86) PCT No.: PCT/CN2019/111011
§ 371 (c)(1),
(2) Date: Mar. 23, 2020

(87) PCT Pub. No.: WO2020/093840
PCT Pub. Date: May 14, 2020

(65) Prior Publication Data
US 2021/0028247 A1 Jan. 28, 2021

(30) Foreign Application Priority Data
Nov. 6, 2018 (CN) .......................... 201821824551.X

(51) Int. Cl.
H01L 27/32 (2006.01)
G02F 1/1333 (2006.01)

(52) U.S. Cl.
CPC .... H01L 27/3218 (2013.01); G02F 1/133388 (2021.01)

(58) Field of Classification Search
None
See application file for complete search history.

(56) References Cited

U.S. PATENT DOCUMENTS

| 2016/0035263 | A1* | 2/2016 | Guo ..................... G09G 3/2003 345/593 |
| 2016/0120005 | A1 | 4/2016 | Wu et al. |
| 2019/0081112 | A1* | 3/2019 | Tsukamoto ......... H01L 51/5218 |
| 2019/0088709 | A1 | 3/2019 | Zeng et al. |

(Continued)

FOREIGN PATENT DOCUMENTS

| CN | 107170364 A | 9/2017 |
| CN | 107481623 A | 12/2017 |

(Continued)

*Primary Examiner* — Phu Vu
(74) *Attorney, Agent, or Firm* — McDermott Will and Emery LLP

(57) ABSTRACT

A pixel structure includes a plurality of pixels, and each of the plurality of pixels includes at least one green sub-pixel and at least one other color sub-pixel. A display region determined by the plurality of pixels includes a main display region and at least one special-shaped display region. A boundary of the at least one special-shaped display region includes an arc-shaped edge. The plurality of pixels include a plurality of pixels disposed in the main display region and a plurality of pixels disposed in the at least one special-shaped display region. In each pixel disposed at a corresponding position of the arc-shaped edge, the at least one green sub-pixel is disposed at a side of the at least one other color sub-pixel proximate to the arc-shaped edge.

17 Claims, 10 Drawing Sheets

(56) References Cited

U.S. PATENT DOCUMENTS

2019/0198581 A1* 6/2019 Kim ................. G02F 1/1343
2020/0013327 A1* 1/2020 Thirumalai .......... G09G 3/3607

FOREIGN PATENT DOCUMENTS

| CN | 107610594 A | 1/2018 |
| CN | 107799013 A | 3/2018 |
| CN | 108447395 A | 8/2018 |

* cited by examiner

PIXEL STRUCTURE, DISPLAY SUBSTRATE AND DISPLAY DEVICE

CROSS-REFERENCE TO RELATED APPLICATIONS

This application is a national phase entry under 35 USC 371 of International Patent Application No. PCT/CN2019/111011 filed on Oct. 14, 2019, which claims priority to Chinese Patent Application No. 201821824551.X, filed with the Chinese Patent Office on Nov. 6, 2018, titled "PIXEL ARRANGEMENT STRUCTURE, DISPLAY SUBSTRATE AND DISPLAY DEVICE", which are incorporated herein by reference in their entirety.

TECHNICAL FIELD

The present disclosure relates to the field of display technologies, and in particular, to a pixel structure, a display substrate and a display device.

BACKGROUND

With the continuous development of display technologies, special-shaped display screens such as "full-screen display screens" and "bangs screens" have attracted widespread attention.

SUMMARY

In an aspect, a pixel circuit is provided. The pixel structure includes a plurality of pixels, and each of the plurality of pixels includes at least one green sub-pixel and at least one other color sub-pixel. A display region determined by the plurality of pixels includes a main display region and at least one special-shaped display region. A boundary of the at least one special-shaped display region includes an arc-shaped edge. The plurality of pixels include a plurality of pixels disposed in the main display region and a plurality of pixels disposed in the at least one special-shaped display region. In each pixel disposed at a corresponding position of the arc-shaped edge, the at least one green sub-pixel is disposed at a side of the at least one other color sub-pixel proximate to the arc-shaped edge.

In some embodiments, a boundary of each special-shaped display region includes an arc-shaped edge, a first straight edge, and a second straight edge that are connected in sequence.

The first straight edge is parallel to a row direction of the plurality of pixels, and the second straight edge is parallel to a column direction of the plurality of pixels. An included angle between the first straight edge and the second straight edge is a right angle, and an intersection point of the first straight edge and the second straight edge is $D_0$. An intersection point of the arc-shaped edge and an angular bisector of the right angle is $D_1$, and the arc-shaped edge is divided into a first arc-shaped segment and a second arc-shaped segment by the intersection point $D_1$.

An intersection point of the first arc-shaped segment and the first straight edge is $D_2$. An intersection point of the first straight edge and a straight line that passes through the intersection point $D_1$ and is parallel to the column direction of the plurality of pixels is $D_3$. In a direction from the intersection point $D_2$ to the intersection point $D_3$, the first arc-shaped segment corresponds to N columns of pixels arranged in sequence, and N is an integer greater than or equal to 2. An included angle between the second straight edge and a connecting line that is between a center of a pixel disposed at a corresponding position of the arc-shaped edge in a j-th column of pixels and the intersection point $D_0$ is $\alpha_j$, and j is an integer greater than 1 and less than or equal to N.

A difference value between a number of pixels of an end of the j-th column of pixels facing the first arc-shaped segment and a number of pixels of an end of a (j−1)-th column of pixels facing the first arc-shaped segment is equal to a value of $\tan \alpha_j$, which takes an integer value.

An intersection point of the second arc-shaped segment and the second straight edge is $D_4$. An intersection point of the second straight edge and a straight line that passes through the intersection point $D_1$ and is parallel to the row direction of the plurality of pixels is $D_5$. In a direction from the intersection point $D_4$ to the intersection point $D_5$, the second arc-shaped segment corresponds to M rows of pixels arranged in sequence, and M is an integer greater than or equal to 2. An included angle between the second straight edge and a connecting line that is between a center of a pixel at a corresponding position of the arc-shaped edge in an i-th row of pixels and the intersection point $D_0$ is $\alpha_i$, and i is an integer greater than 1 and less than or equal to M.

A difference value between a number of pixels of an end of the i-th row of pixels facing the second arc-shaped segment and a number of pixels of an end of an (i−1)-th row of pixels facing the second arc-shaped segment is equal to a reciprocal of a value of $\tan \alpha_i$, which takes an integer value.

In some embodiments, the included angle $\alpha_j$ is within a range from 45° to 90°, inclusive.

In some embodiments, the included angle $\alpha_i$ is greater than or equal to 0°, and less than 45°.

In some embodiments, in each pixel disposed at a corresponding position of the arc-shaped edge, a shape of the at least one green sub-pixel includes a first hypotenuse facing the arc-shaped edge, and there is an included angle between the first hypotenuse and a tangent line at a corresponding position of the arc-shaped edge.

In some embodiments, the included angle between the first hypotenuse and the tangent line at a corresponding position of the arc-shaped edge is within a range from 0° to 45°, inclusive.

In some embodiments, in each pixel disposed at a corresponding position of the arc-shaped edge, a shape of the at least one green sub-pixel includes a triangle, a pentagon, a trapezoid or a rhombus.

In some embodiments, in each pixel disposed at a corresponding position of the arc-shaped edge, a shape of the at least one sub-pixel of other color includes a second hypotenuse facing the arc-shaped edge, and there is an included angle between the second hypotenuse and a tangent line at a corresponding position of the arc-shaped edge.

In some embodiments, the included angle between the second hypotenuse and the tangent line at a corresponding position of the arc-shaped edge is within a range from 0° to 45°, inclusive.

In some embodiments, in each pixel disposed at a corresponding position of the arc-shaped edge, a shape of the at least one other color sub-pixel includes a triangle, a pentagon, a trapezoid or a rhombus.

In some embodiments, an effective display area of each sub-pixel disposed in the at least one special-shaped display region is equal to an effective display area of each sub-pixel with a same color disposed in the main display region.

In some embodiments, the plurality of pixels include a plurality of first pixels and a plurality of second pixels. In each of the plurality of first pixels, the at least one other color sub-pixel includes a single red sub-pixel, and in each of the plurality of second pixels, the at least one other color sub-pixel includes a single blue sub-pixel.

In a column direction of the plurality of pixels, a first pixel row in which a plurality of first pixels are arranged and a second pixel row in which a plurality of second pixels are arranged are alternately arranged.

In the column direction of the plurality of pixels, in a plurality of pixels in a same column, a first pixel and a second pixel are alternately arranged. In a plurality of pixels in a same column, green sub-pixels in a plurality of first pixels and green sub-pixels in a plurality of second pixels are arranged in a column, and red sub-pixels in the plurality of first pixels and blue sub-pixels in the plurality of second pixels are arranged in a column.

In some embodiments, the plurality of pixels include a plurality of first pixels and a plurality of second pixels. In each of the plurality of first pixels, the at least one other color sub-pixel includes a single red sub-pixel, and in each of the plurality of second pixels, the at least one other color sub-pixel includes a single blue sub-pixel.

In a row direction of the plurality of pixels, in a plurality of pixels in a same row, a first pixel and a second pixel are alternately arranged.

In a column direction of the plurality of pixels, in a plurality of pixels in a same column, a first pixel and a second pixel are alternately arranged. In a plurality of pixels in a same column, green sub-pixels in a plurality of first pixels and green sub-pixels in a plurality of second pixels are arranged in a column, and red sub-pixels in the plurality of first pixels and blue sub-pixels in the plurality of second pixels are arranged in a column. Or, in the row direction of the plurality of pixels, a first pixel column in which a plurality of first pixels are arranged and a second pixel column in which a plurality of second pixels are arranged are alternately arranged. Green sub-pixels in the plurality of first pixel of the first pixel column are arranged in a column, and red sub-pixels in the plurality of first pixels of the first pixel column are arranged in a column. Green sub-pixels in the plurality of second pixels of the second pixel column are arranged in a column, and blue sub-pixels in the plurality of second pixels of the second pixel column are arranged in a column.

In some embodiments, in each of the plurality of pixels, the at least one green sub-pixel includes a single green sub-pixel, and the at least one other color sub-pixel includes a single red sub-pixel and a single blue sub-pixel.

In a row direction of the plurality of pixels, in a plurality of pixels in each row, a green sub-pixel, a red sub-pixel and a blue sub-pixel are periodically arranged.

In a column direction of the plurality of pixels, in a plurality of pixels in each column, a green sub-pixel, a red sub-pixel and a blue sub-pixel are periodically arranged.

In a perpendicular direction of a diagonal direction of the plurality of pixels, a green sub-pixel diagonal column in which a plurality of green sub-pixels are arranged, a red sub-pixel diagonal column in which a plurality of red sub-pixels are arranged, and a blue sub-pixel diagonal column in which a plurality of blue sub-pixels are arranged are periodically arranged.

In some embodiments, in each of the plurality of pixels, the at least one green sub-pixel includes a single green sub-pixel, and the at least one other color sub-pixel includes a single red sub-pixel and a single blue sub-pixel.

In a row direction of the plurality of pixels, in a plurality of pixels in each row, a green sub-pixel, a red sub-pixel and a blue sub-pixel are periodically arranged.

In the row direction of the plurality of pixels, a green sub-pixel column in which a plurality of green sub-pixels are arranged, a red sub-pixel column in which a plurality of red sub-pixels are arranged, and a blue sub-pixel column in which a plurality of blue sub-pixels are arranged are periodically arranged.

In another aspect, a display substrate is provided. The display substrate includes the pixel structure as provided in some embodiments described above.

In yet another aspect, a display device is provided. The display device includes the display substrate as provided in some embodiments described above.

BRIEF DESCRIPTION OF THE DRAWINGS

In order to describe technical solutions in some embodiments of the present disclosure more clearly, the accompanying drawings to be used in some embodiments will be introduced briefly. Obviously, the accompanying drawings to be described below are merely some embodiments of the present disclosure, and a person of ordinary skill in the art may obtain other drawings according to these drawings without paying any creative effort.

DETAILED DESCRIPTION

In order to make the above objectives, features and advantages of the present disclosure more comprehensible, the technical solutions in some embodiments of the present disclosure will be described clearly and completely with reference to the accompanying drawings in some embodiments of the present disclosure. Obviously, the described embodiments are merely some but not all of the embodiments of the present disclosure.

A boundary of a display region of a special-shaped display screen includes a curved boundary. At a corresponding position of the curved boundary, a plurality of columns (or rows) of pixels in the special-shaped display screen are generally arranged in a step shape. That is, at the curved boundary of the special-shaped display screen, one end of a column of pixels proximate to the curved boundary has a certain number of pixels more than or less than one end of an adjacent column of pixels proximate to the curved boundary; or, one end of a row of pixels proximate to the curved boundary has a certain number of pixels more than or less than one end of an adjacent row of pixels proximate to the curved boundary. As a result, the curved boundary of the display region presents a visual effect of a curve on a macroscopic scale.

Figure 12:
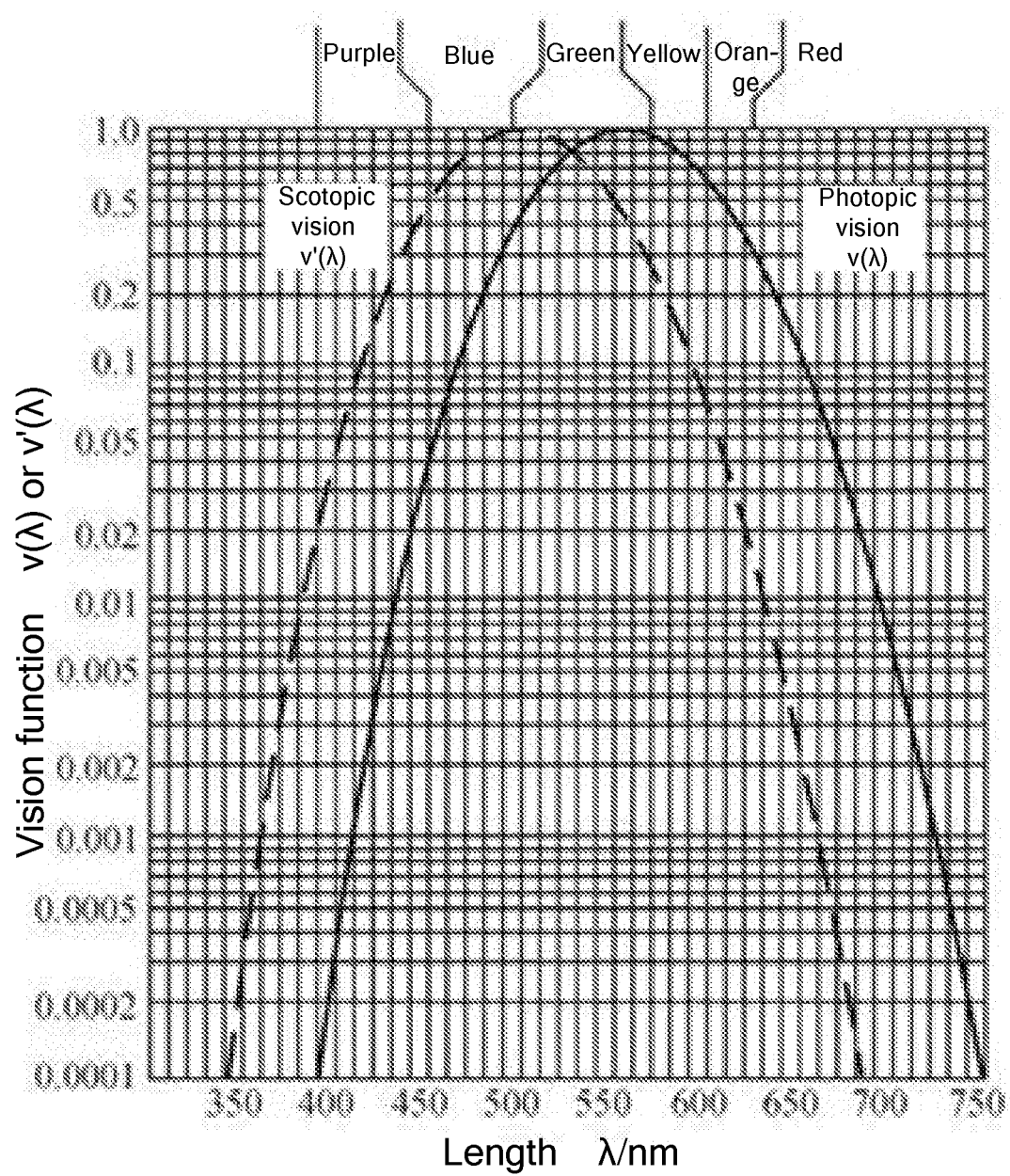
FIG. 12 is a schematic diagram of a visual function, according to some embodiments of the present disclosure.

In the related art, sub-pixels of other colors (such as red sub-pixels or blue sub-pixels) than green sub-pixels are generally arranged in sub-pixels of pixels proximate to a curved boundary of a special-shaped display screen. As can be seen from a visual function shown in FIG. 12, in a visible spectrum, human eyes have a strong perception for green light displayed by green sub-pixels, and have a weak perception for light displayed by sub-pixels of other colors other than the green sub-pixels. In this way, it is easy to generate discontinuity of display perception at the curved boundary, causing a jaggy feeling and a grainy feeling to be displayed at the curved boundary.

Figure 1:
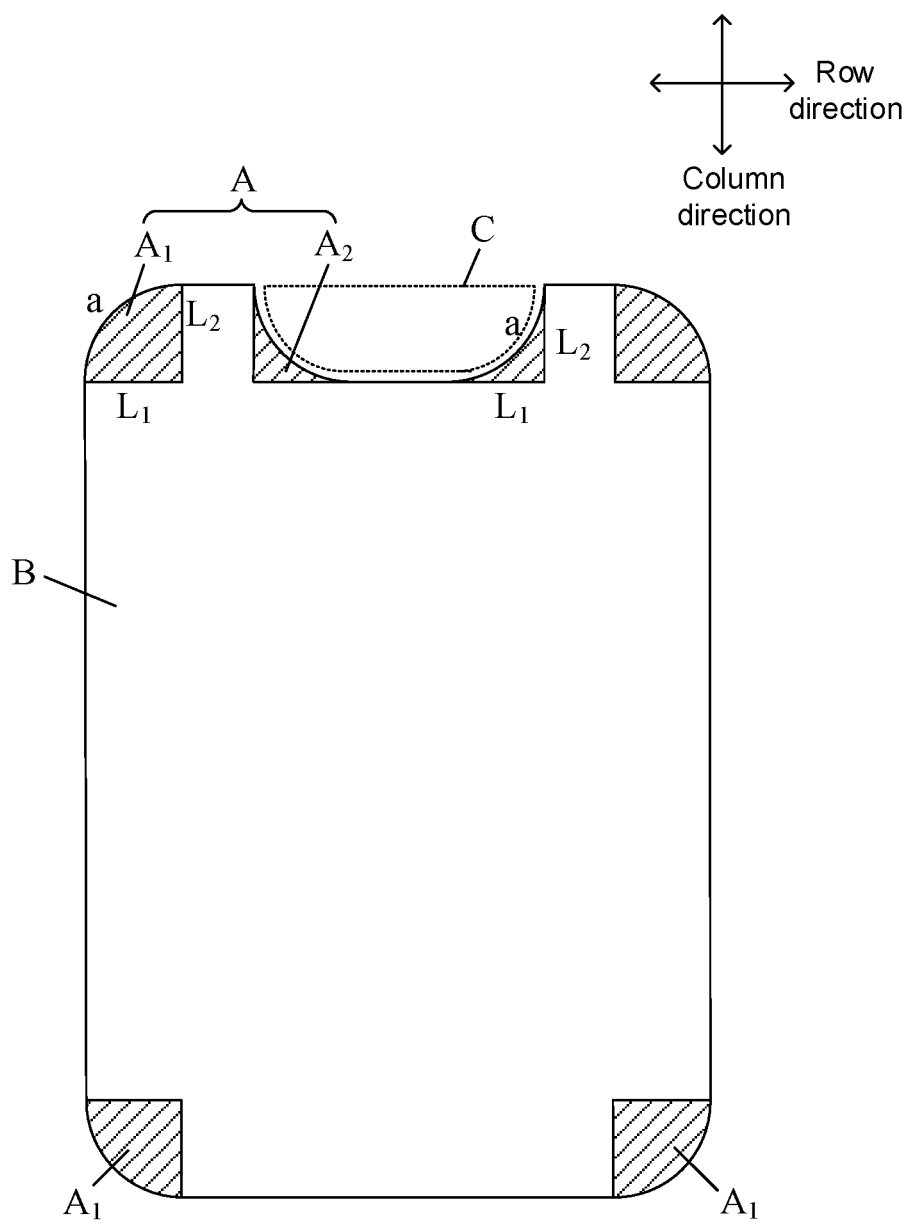
FIG. 1 is a schematic diagram of a pixel structure, according to some embodiments of the present disclosure.
Figure 2:
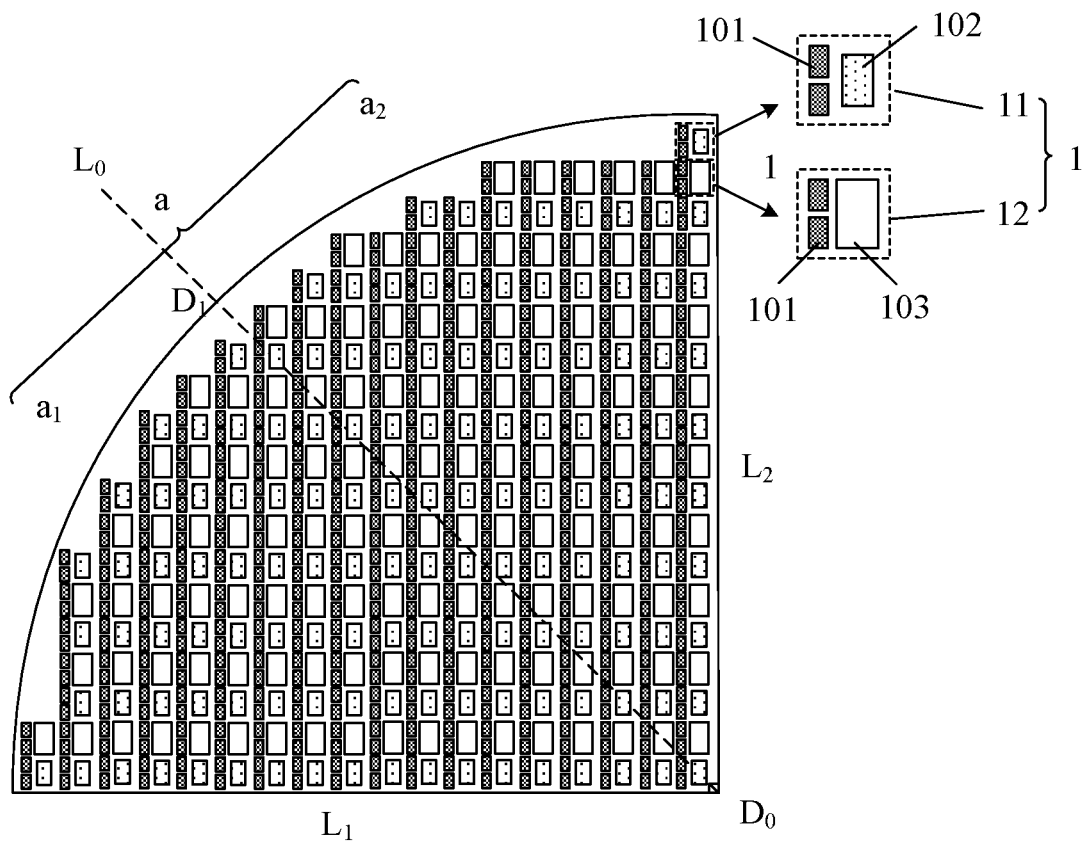
FIG. 2 is a schematic diagram of a part of a pixel structure disposed in a special-shaped display region, according to some embodiments of the present disclosure.
Figure 5:
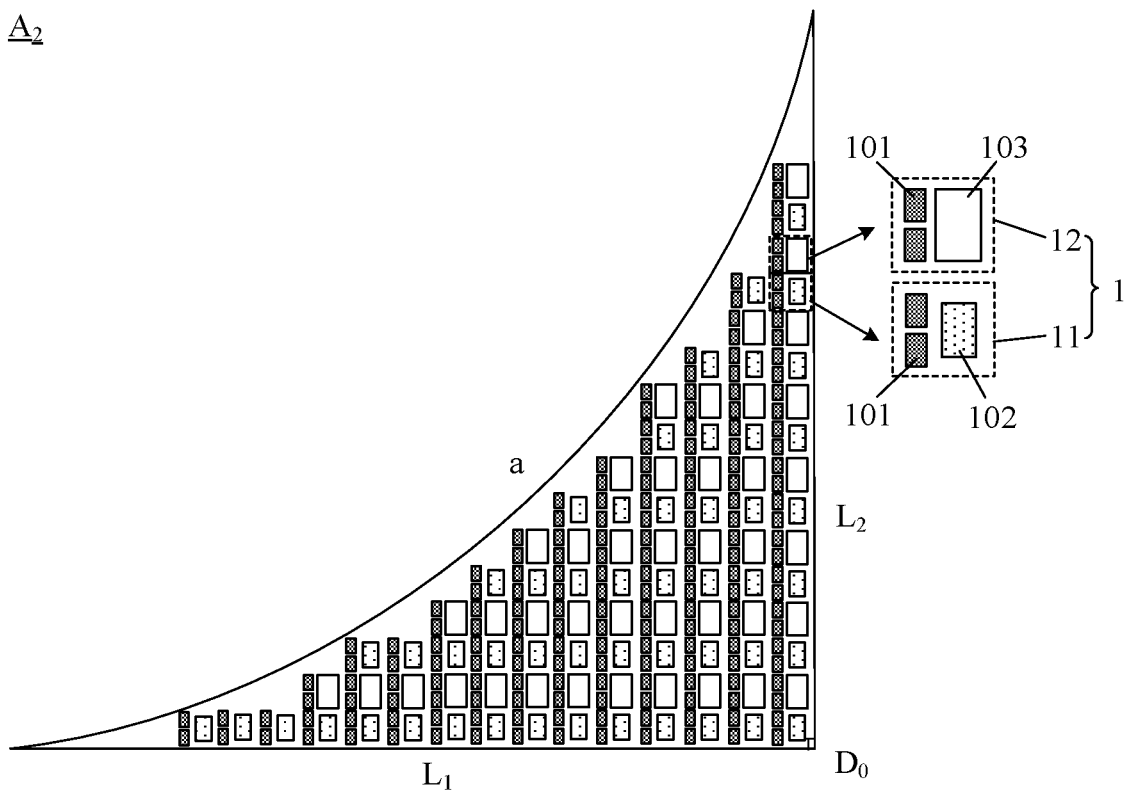
FIG. 5 is a schematic diagram of a part of another pixel structure disposed in a special-shaped display region, according to some embodiments of the present disclosure.

Some embodiments of the present disclosure provide a pixel structure 100. Referring to FIGS. 1, 2 and 5, the pixel structure 100 includes a plurality of pixels 1, and the plurality of pixels 1 are generally arranged in an array. Each of the plurality of pixels 1 includes at least one green sub-pixel 101 and at least one other color sub-pixel (such as at least one red sub-pixel 102 or at least one blue sub-pixel 103). A display region determined by the plurality of pixels 1 includes a main display region B and at least one special-shaped display region A. A boundary of the at least one special-shaped display region A includes an arc-shaped edge a. In each pixel 1 disposed at a corresponding position of the arc-shaped edge a, the at least one green sub-pixel 101 is disposed at a side of the at least one other color sub-pixel proximate to the arc-shaped edge a.

In some embodiments, referring to FIG. 1, a boundary of each special-shaped display region A further includes: a first straight edge $L_1$ connected to one end of the arc-shaped edge a, and a second straight edge $L_2$ connected to the other end of the arc-shaped edge a. The first straight edge $L_1$ is parallel to a row direction of the plurality of pixels 1, and the second straight side $L_2$ is parallel to a column direction of the plurality of pixels 1. One end of the first straight edge $L_1$ that is not connected to the arc-shaped edge a is intersected with one end of the second straight edge $L_2$ that is not connected to the arc-shaped edge a at a right angle.

In the pixel structure 100 provided by some embodiments of the present disclosure, a shape of the special-shaped display region A is related to a shape of the arc-shaped edge a of the boundary of the special-shaped display region A.

In some examples, referring to FIG. 1, the arc-shaped edge a is curved toward the right angle, that is, a center of curvature of the arc-shaped edge a is disposed at a side of the arc-shaped edge a facing the right angle. In this case, a shape of a special-shaped display region A is a shape as shown by a first special-shaped display region $A_1$.

In some other examples, with continued reference to FIG. 1, the arc-shaped edge a is curved away from the right angle, that is, a center of curvature of the arc-shaped edge a is disposed at a side of the arc-shaped edge a away from the right angle. In this case, a shape of a special-shaped display region A is a shape as shown by a second special-shaped display region $A_2$. Herein, in a case where the at least one special-shaped display region A includes two second special-shaped display regions $A_2$, and the two second special-shaped display regions $A_2$ cooperate to form a notch C, accessory components (such as a handset, a camera of a mobile phone, etc.) of a terminal may be integrally held by using the notch C.

Each of a part of the plurality of pixels 1 is disposed at a corresponding position of the arc-shaped edge a, which is represented as follows: the part of pixels 1 is proximate to the arc-shaped edge a (as shown in FIG. 2); or, the part of pixels 1 is tangent to the arc-shaped edge a (as shown in FIG. 5).

In each of the part of pixels 1, the at least one green sub-pixel 101 is disposed at a side of the at least one other color sub-pixel proximate to the arc-shaped edge a. That is, in each pixel 1 most proximate to the arc-shaped edge a in a same special-shaped display region A, the at least one green sub-pixel 101 is disposed at a position most proximate to the arc-shaped edge a relative to the at least one other color sub-pixel.

In the pixel structure 100 provided by some embodiments of the present disclosure, the at least one green sub-pixel 1 in each pixel 1, which is disposed at a corresponding position of the arc-shaped edge a of the special-shaped display region A, is disposed at a side most proximate to the arc-shaped edge a. In this way, by utilizing characteristics that human eyes are most sensitive to green light and have the strongest perception to green light, perception intensity of human eyes for the sub-pixels at the arc-shaped edge a (i.e., the curved boundary of the display region determined by the plurality of pixels 1) may be improved. As a result, display luminance of the sub-pixels at the curved boundary may be ensured, continuity of the display perception at the curved boundary may be improved, and a jaggy feeling and a grainy feeling to be displayed at the curved boundary may be reduced, which may be further conducive to improving visual effect of the special-shaped display screen.

In some embodiments of the present disclosure, as shown in FIG. 1, an effective display area of each sub-pixel disposed in the special-shaped display region A is equal to an effective display area of each sub-pixel with a same color disposed in the main display region B. In this way, a problem of color cast caused by inconsistency between the effective display area of each sub-pixel disposed at the curved boundary of the display region and the effective display area of a corresponding sub-pixel in the main display region B may be avoided, which may effectively improve the visual effect of the special-shaped display screen.

Herein, the term "effective display area" refers to an area actually used for display in each sub-pixel. For example, in an organic light-emitting diode (OLED) display panel, the term "effective display area" refers to a light-emitting area of each sub-pixel. In a liquid crystal display (LCD) panel, the term "effective display area" refers to a light-transmitting area of each sub-pixel.

In the pixel structure 100, there is a difference in the number of pixels 1 of ends of adjacent pixel rows or adjacent pixel columns in the special-shaped display region A that are proximate to corresponding positions of the arc-shaped edge a. The difference value is related to an included angle between the second straight edge $L_2$ and a connecting line that is between a center of a pixel 1 disposed at a corresponding position of the arc-shaped edge a in each pixel row or each pixel column and a point $D_0$.

In the following, the first special-shaped display region $A_1$ is taken as an example to schematically describe the difference in the number of pixels 1 of ends of adjacent pixel rows or adjacent pixel columns in the special-shaped display region $A_1$ that are proximate to corresponding positions of the arc-shaped edge a.

Figure 3:
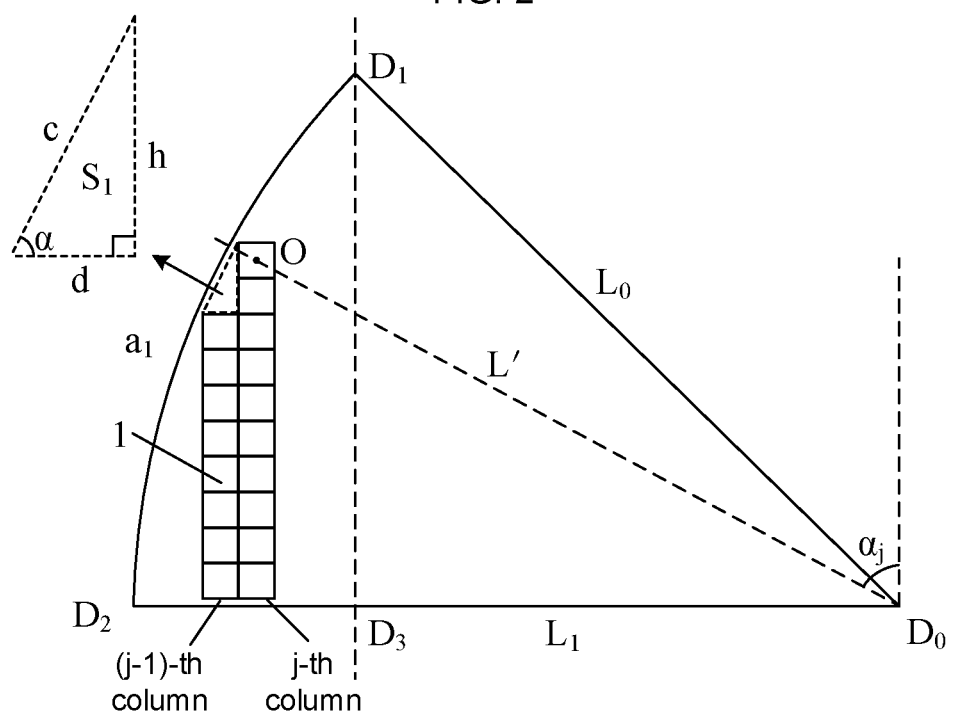
FIG. 3 is a schematic diagram showing a principle for calculating the number of pixels disposed at corresponding positions of an arc-shaped edge in the pixel structure shown in FIG. 2.
Figure 4:
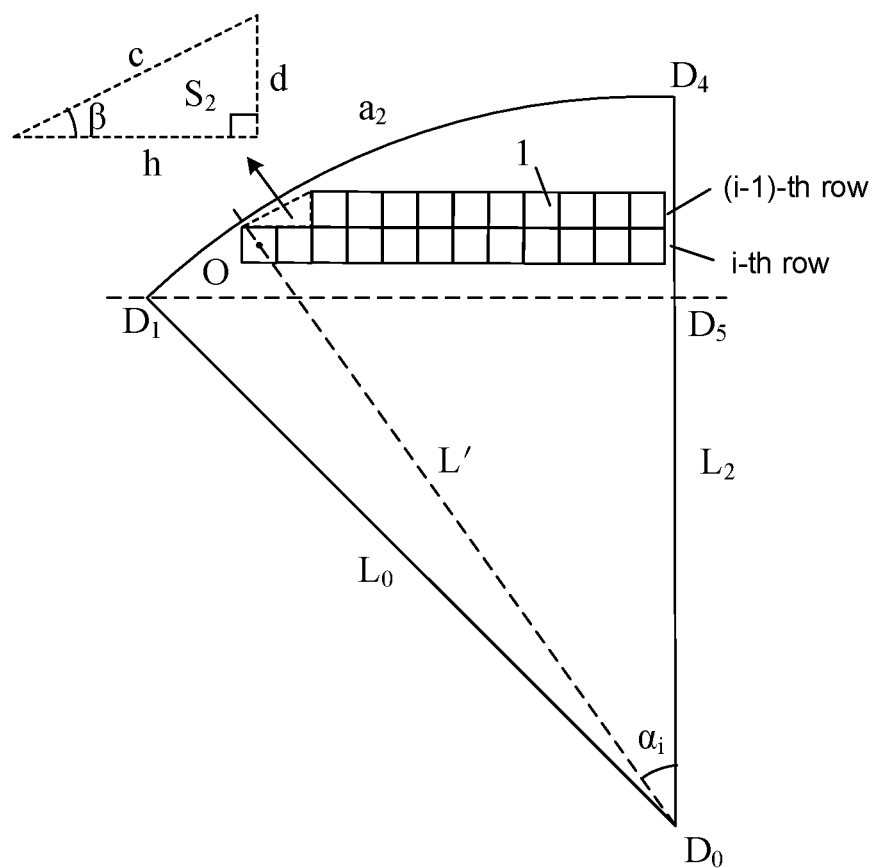
FIG. 4 is a schematic diagram showing another principle for calculating the number of pixels at corresponding positions of an arc-shaped edge in the pixel structure shown in FIG. 2.

Referring to FIGS. 2 to 4, an intersection point of the first straight edge $L_1$ and the second straight edge $L_2$ of the first special-shaped display region $A_1$ is $D_0$. An intersection point of an angular bisector $L_0$ of the right angle, which is formed by the intersection of the first straight edge $L_1$ and the second straight edge $L_2$, and the arc-shaped edge a is $D_1$. The arc-shaped edge a is divided into a first arc-shaped segment $a_1$ and a second arc-shaped segment $a_2$ by the intersection point $D_1$.

Referring to FIG. 3, an intersection point of the first arc-shaped segment $a_1$ and the first straight edge $L_1$ is $D_2$. An intersection point of the first straight edge $L_1$ and a straight line that passes through the intersection point $D_1$ and is parallel to the column direction of the plurality of pixels 1 is $D_3$. In a direction from the intersection point $D_2$ to the intersection point $D_3$, the first arc-shaped segment $a_1$ corresponds to N columns of pixels, and N is an integer greater than or equal to 2 (i.e., N≥2). An included angle between the second straight edge $L_2$ and a connecting line L' that is between a center O of a pixel 1 at a corresponding position of the arc-shaped edge a in a j-th column of pixels 1 and the intersection point $D_0$ is $\alpha_j$, and j is an integer greater than 1 and less than or equal to N (i.e., 1<j≤N). Herein, $\alpha_j$ is within a range from 45° to 90°, inclusive (i.e., 45°≤$\alpha_j$≤90°). A difference value between the number of pixels 1 of one end of the j-th column of pixels 1 proximate to the first arc-shaped segment $a_1$ and the number of pixels 1 of one end of a (j−1)-th column of pixels 1 proximate to the first arc-shaped segment $a_1$ (that is, the number of pixels 1 by which one end of the j-th column of pixels 1 proximate to the first arc-shaped segment $a_1$ exceeds one end of the (j−1)-th column of pixels 1 proximate to the first arc-shaped segment $a_1$) is equal to a value of tan $\alpha_j$, which takes an integer value. That is, in a direction from the intersection point $D_2$ to the intersection point $D_3$, in columns of pixels 1 corresponding to the first arc-shaped segment $a_1$, the number of pixels 1 by which one end of a next column of pixels 1 proximate to the first arc-shaped segment $a_1$ exceeds one end of a present column of pixels 1 proximate to the first arc-shaped segment $a_1$ may be set according to the integer value of tan $\alpha_j$.

In the pixel structure 100, each pixel 1 is approximately regarded as a square. It is assumed that a side length of each pixel 1 is d, and a length by which one end of the j-th column of pixels 1 proximate to the first arc-shaped segment $a_1$ exceeds one end of the (j−1)-th column of pixels 1 proximate to the first arc-shaped segment $a_1$ is h. A right-angled triangle $S_1$ is determined by using d and h as two right-angled sides, and an included angle between a hypotenuse c and the right-angled side d of the right-angled triangle $S_1$ is a. A slope of a tangent line at an intersection point between the first arc-shaped segment $a_1$ and a connecting line that is between a center O of a pixel 1 at a corresponding position of the arc-shaped edge a (the first arc-shaped segment $a_1$) in the j-th column of pixels 1 and the intersection point $D_0$ is approximately equal to a slope of the hypotenuse c of the right-angled triangle $S_1$. Therefore, the included angle α and the included angle $\alpha_j$ may be regarded as approximately equal, and an equation may be obtained from the above geometric relationship: tan $\alpha_j$=tan α=h/d. Since d corresponds to a single pixel 1, and h corresponds to the number of pixels 1 by which one end of the j-th column of pixels 1 proximate to the first arc-shaped segment $a_1$ exceeds one end of the (j−1)-th column of pixels proximate to the first arc-shaped segment $a_1$, the integer value of the value h/d of tan $\alpha_j$ may be the number of pixels 1 by which one end of the j-th column of pixels 1 proximate to the first arc-shaped segment $a_1$ exceeds one end of the (j−1)-th column of pixels 1 proximate to the first arc-shaped segment $a_1$.

Herein, the value of tan $\alpha_j$ is rounded according to the rounding principle. For example, $\alpha_j$=85°, tan $\alpha_j$≈11.43, and the integer value of tan $\alpha_j$ is 11. In a case where $\alpha_j$ is 85°, one end of a corresponding pixel column proximate to the first arc-shaped segment $a_1$ exceeds one end of a previous pixel column proximate to the first arc-shaped segment $a_1$ by eleven pixels 1. For another example, $\alpha_j$=50°, tan $\alpha_j$≈1.19, and the integer value of tan $\alpha_j$ is 1. In a case where $\alpha_j$ is 50°, one end of a corresponding pixel column proximate to the first arc-shaped segment $a_1$ exceeds one end of a previous pixel column proximate to the first arc-shaped segment $a_1$ by a single pixels 1.

It will be noted that, in a process that $\alpha_j$ is sequentially decreased between 45° and 90°, the number of columns of pixel columns having a difference in the number of pixels 1 between ends of the pixel columns proximate to the first arc-shaped segment $a_1$ is progressively increased, and a difference value between the numbers of pixels 1 of ends of adjacent pixel columns proximate to the first arc-shaped segment $a_1$ is also progressively changed correspondingly. In a process that $\alpha_j$ is sequentially increased between 45° and 90°, the number of columns of pixel columns having a difference in the number of pixels 1 between ends of the pixel columns proximate to the first arc-shaped segment $a_1$ is progressively decreased, and a difference value between the numbers of pixels 1 of ends of adjacent pixel columns proximate to the first arc-shaped segment $a_1$ is also progressively changed correspondingly.

The number of pixels 1 that are arranged in a step shape at the curved boundary of the display region is set through the arrangement manner described above. As a result, smoothness of pixel arrangement of the pixel structure 100 at the curve boundary may be improved, a jaggy feeling and a grainy feeling visually at the curved boundary may be reduced, and thus a visual effect of the special-shaped display screen may be improved.

Referring to FIG. 4, an intersection point of the second arc-shaped segment $\alpha_2$ and the second straight edge $L_2$ is $D_4$. An intersection point of the second straight edge $L_2$ and a straight line that passes through the intersection point $D_1$ and is parallel to the row direction of the plurality of pixels 1 is $D_5$. In a direction from the intersection point $D_4$ to the intersection point $D_5$, the second arc-shaped segment $a_2$ corresponds to M rows of pixels 1, and M is an integer greater than or equal to 2 (i.e., M≥2). An included angle between the second straight edge $L_2$ and a connecting line L' that is between a center O of a pixel 1 at a corresponding position of the arc-shaped edge a in an i-th row of pixels 1 and the intersection point $D_0$ is $\alpha_i$, and i is an integer greater than 1 and less than or equal to M (i.e., 1<i≤M). Herein, $\alpha_i$ is greater than or equal to 0° and less than 45° (i.e., 0°≤$\alpha_i$<45°). A difference value between the number of pixels 1 of one end of the i-th row of pixels 1 proximate to the second arc-shaped segment $a_2$ and the number of pixels 1 of one end of an (i−1)-th row of pixels 1 proximate to the second arc-shaped segment $a_2$ (that is, the number of pixels 1 by which one end of the i-th row of pixels 1 proximate to the second arc-shaped segment $a_2$ exceeds one end of the (i−1)-th row of pixels 1 proximate to the second arc-shaped segment $a_2$) is equal to a reciprocal of a value of tan $\alpha_i$, which takes an integer value. That is, in a direction from the intersection point $D_4$ to the intersection point $D_5$, in rows of pixels 1 corresponding to the second arc-shaped segment $a_2$, the number of pixels 1 by which one end of a next row of pixels 1 proximate to the second arc-shaped segment $a_2$ exceeds one end of a present row of pixels 1 proximate to the second arc-shaped segment $a_2$ may be set according to the integer value of the reciprocal of the value of tan $\alpha_i$.

In the pixel structure 100, each pixel 1 is approximately regarded as a square. It is assumed that a side length of each pixel 1 is d, and a length by which one end of the i-th row of pixels 1 proximate to the second arc-shaped segment $a_2$ exceeds one end of the (i−1)-th row of pixels 1 proximate to the second arc-shaped segment $a_2$ is h. A right-angled triangle $S_2$ is determined by using d and h as two right-angled sides, and an included angle between a hypotenuse c and the right-angled side h of the right-angled triangle $S_2$ is β. A slope of a tangent line at an intersection point between the second arc-shaped segment $a_2$ and a connecting line that is between a center O of a pixel 1 at a corresponding position of the arc-shaped edge a (the second arc-shaped segment $a_2$) in the i-th row of pixels 1 and the intersection point $D_0$ is approximately equal to a slope of the hypotenuse c of the right-angled triangle $S_2$. Therefore, the included angle β and the included angle $\alpha_i$ may be regarded as approximately equal, and an equation may be obtained from the above geometric relationship: tan $\alpha_i$=tan β=d/h. Since d corresponds to a single pixel 1, and h corresponds to the number of pixels 1 by which one end of the i-th row of pixels 1 proximate to the second arc-shaped segment $a_2$ exceeds one end of the (i−1)-th row of pixels 1 proximate to the first arc-shaped segment $a_2$, the integer value of the reciprocal h/d of the value of tan $\alpha_i$ may be the number of pixels 1 by which one end of the i-th row of pixels 1 proximate to the second arc-shaped segment $a_2$ exceeds one end of the (i−1)-th row of pixels 1 proximate to the second arc-shaped segment $a_2$.

Herein, the reciprocal of the value of tan $\alpha_i$ is rounded according to the rounding principle. For example, $\alpha_i$=25°, the reciprocal of tan $\alpha_i$ is approximately 2.14, and the integer value of the reciprocal of tan $\alpha_i$ is 2. In a case where $\alpha_i$ is 25°, one end of a corresponding pixel row proximate to the second arc-shaped segment $a_2$ exceeds one end of a previous pixel row proximate to the second arc-shaped segment $a_2$ by two pixels 1. For another example, $\alpha_i$=10°, the reciprocal of tan $\alpha_i$ is approximately 5.67, and the integer value of the reciprocal of tan $\alpha_i$ is 6. In a case where a is 10°, one end of a corresponding pixel row proximate to the second arc-shaped segment $a_2$ exceeds one end of a previous pixel row proximate to the second arc-shaped segment $a_2$ by six pixels 1.

It will be noted that, in a process that $\alpha_i$ is sequentially decreased (or sequentially increased) between 0° and 45°, the number of rows of pixel rows having a difference in the number of pixels 1 between ends of the pixel rows proximate to the second arc-shaped segment $a_2$ is progressively decreased (or progressively increased). A difference value between the numbers of pixels 1 of ends of adjacent pixel rows proximate to the second arc-shaped segment $a_2$ is also progressively changed correspondingly.

The number of pixels 1 that are arranged in a step shape at the curved boundary of the display region is set through the arrangement manner described above. As a result, smoothness of pixel arrangement of the pixel structure 100 at the curve boundary may be improved, a jaggy feeling and a grainy feeling visually at the curved boundary may be reduced, and thus a visual effect of the special-shaped display screen may be improved.

In some embodiments of the present disclosure, in the pixel structure 100, the sub-pixels in each pixel 1 disposed at a corresponding position of the arc-shaped edge a include a plurality of structures. The plurality of structures are selectively set according to actual needs, which is not limited in some embodiments of the present disclosure.

Figure 6:
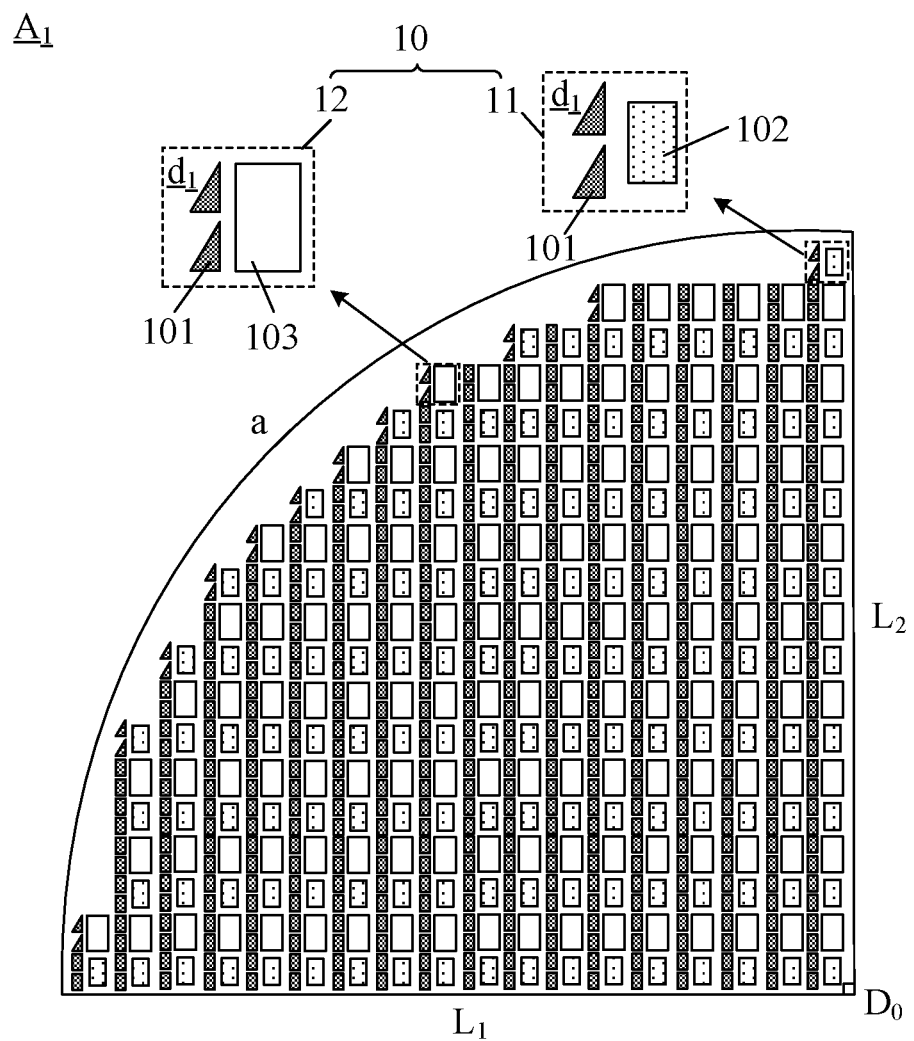
FIG. 6 is a schematic diagram of a part of yet another pixel structure disposed in a special-shaped display region, according to some embodiments of the present disclosure.

In some examples, referring to FIG. 6, in each pixel 1 disposed at a corresponding position of the arc-shaped edge a, a side of the at least one green sub-pixel 101 proximate to the arc-shaped edge a has a first hypotenuse $d_1$. There is an included angle between the first hypotenuse $d_1$ and a tangent line at a corresponding position of the arc-shaped edge a. For example, the included angle between the first hypotenuse $d_1$ and the tangent line at the corresponding position of the arc-shaped edge a is within a range from 0° to 45°, inclusive. That is, the first hypotenuse $d_1$ is parallel or approximately parallel to a tangent line at the corresponding position of the arc-shaped edge a. In this way, visual prominence caused by the difference in the numbers of pixels 1 between adjacent pixel rows or adjacent pixel columns at the arc-shaped edge a may be weakened, so that the display at the curved boundary of the display region is macroscopically smoother, a jaggy feeling and a grainy feeling at the curved boundary may be reduced, and the visual effect of the special-shaped display screen may be improved.

Herein, the at least one green sub-pixel 101 has a plurality of shapes. For example, a shape of the at least one green sub-pixel 101 includes a triangle as shown in FIG. 6, a pentagon (e.g., a pentagon formed by missing a corner of a rectangle), a trapezoid or a rhombus.

Figure 7:
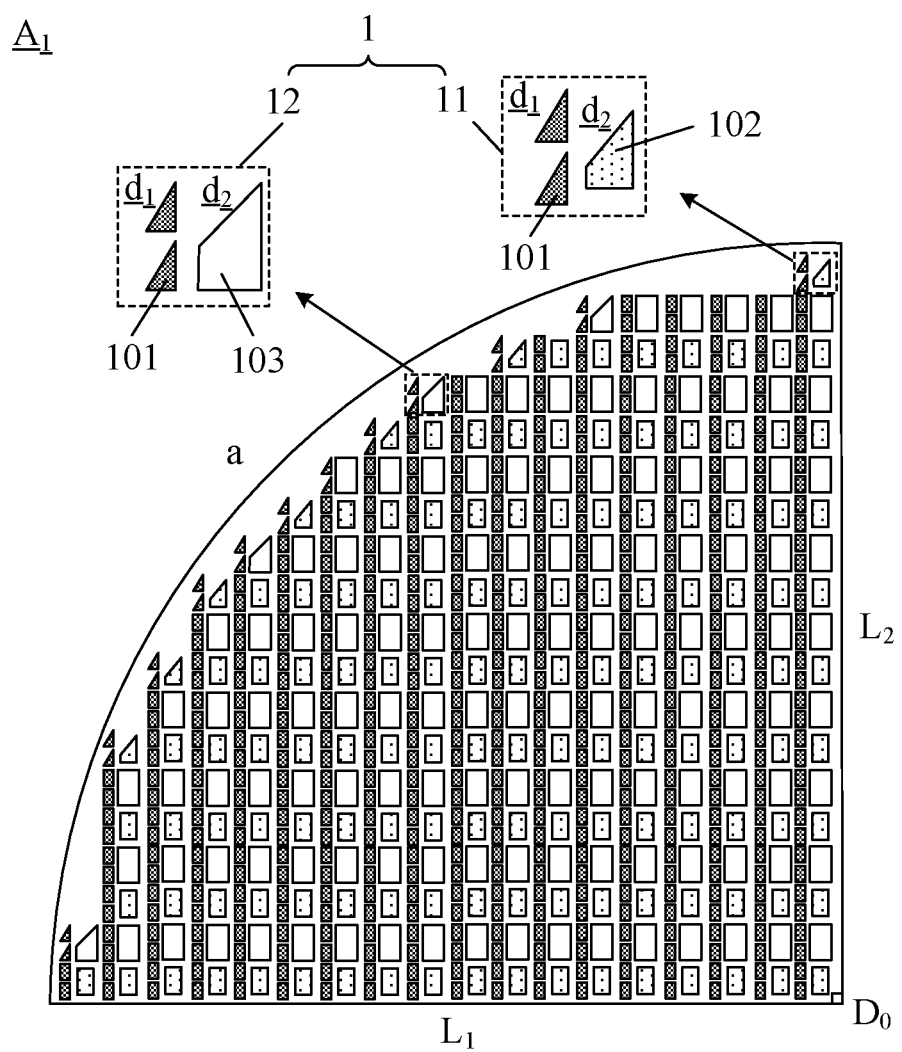
FIG. 7 is a schematic diagram of a part of yet another pixel structure disposed in a special-shaped display region, according to some embodiments of the present disclosure.

In some other examples, referring to FIG. 7, in each pixel 1 disposed at a corresponding position of the arc-shaped edge a, a side of the at least one other color sub-pixel (e.g., a red sub-pixel 102 or a blue sub-pixel 103) proximate to the arc-shaped edge a has a second hypotenuse $d_2$. There is an included angle between the second hypotenuse $d_2$ and a tangent line at a corresponding position of the arc-shaped edge a. For example, the included angle between the second hypotenuse $d_2$ and the tangent line at the corresponding position of the arc-shaped edge a is within a range from 0° to 45°, inclusive. That is, the second hypotenuse $d_2$ is parallel or approximately parallel to the tangent line at the corresponding position of the arc-shaped edge a. In this way, the visual prominence caused by the difference in the numbers of pixels 1 between adjacent pixel rows or adjacent pixel columns at the arc-shaped edge a may be weakened, so that the display at the curved boundary of the display region is macroscopically smoother, a jaggy feeling and a grainy feeling at the curved boundary may be reduced, and the visual effect of the special-shaped display screen may be improved.

Herein, the at least one other color sub-pixel has a plurality of shapes. For example, a shape of the at least one other color sub-pixel includes a triangle, a pentagon (e.g., a pentagon formed by missing a corner of a rectangle), a trapezoid or a rhombus.

In the pixel structure 100 provided by some embodiments of the present disclosure, the plurality of pixels 1 included in the pixel structure 100 have a plurality of design manners. The plurality of design manners are related to a structure of each pixel 1.

In some embodiments, the plurality of pixels 1 included in the pixel structure 100 include a plurality of first pixels 11 and a plurality of second pixels 12. Each of the plurality of first pixels 11 includes at least one green sub-pixel 101 and a single red sub-pixel 102. Each of the plurality of second pixels 12 includes at least one green sub-pixel 101 and a single blue sub-pixel 103.

Figure 8:
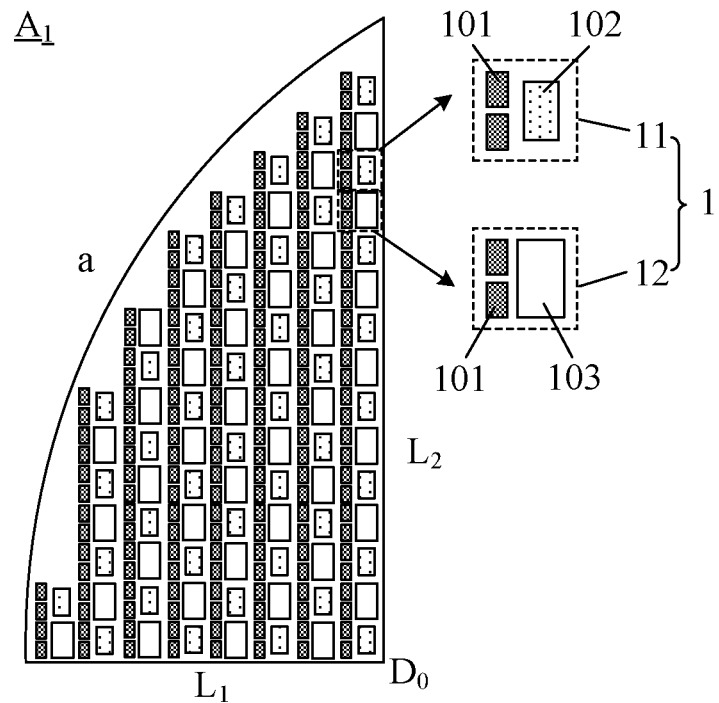
FIG. 8 is a schematic diagram of a part of yet another pixel structure disposed in a special-shaped display region, according to some embodiments of the present disclosure.
Figure 9:
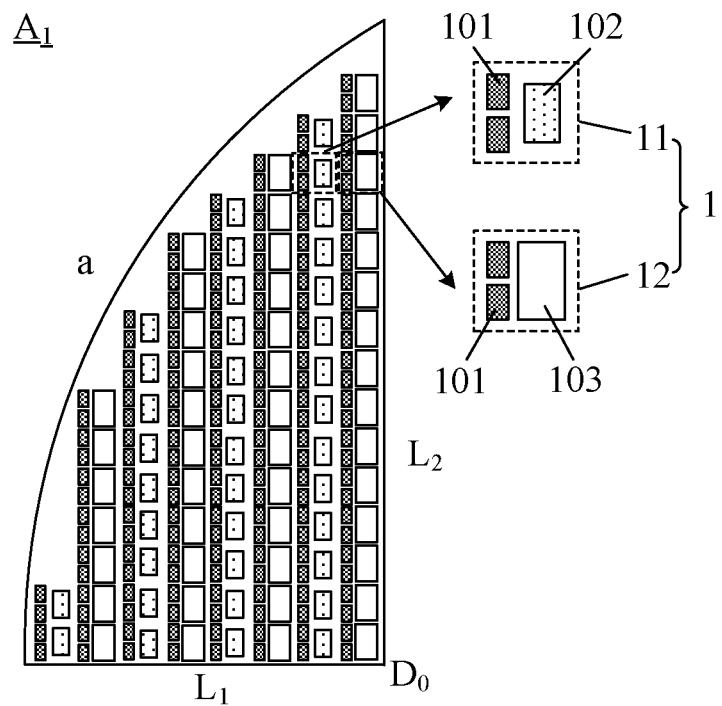
FIG. 9 is a schematic diagram of a part of yet another pixel structure disposed in a special-shaped display region, according to some embodiments of the present disclosure.

Herein, the plurality of pixels 1 have a plurality of design manners. Referring to FIGS. 2, 8 and 9, and the plurality of design manners of the plurality of pixels 1 are schematically described below.

In some examples, referring to FIG. 2, in the column direction of the plurality of pixels 1, a first pixel row in which a plurality of first pixels 11 are arranged and a second pixel row in which a plurality of second pixels 12 are arranged are alternately arranged. In the column direction of the plurality of pixels 1, in a plurality of pixels 1 in a same column, a first pixel 11 and a second pixel 12 are alternately arranged. And in a plurality of pixels 1 in a same column, green sub-pixels 101 in first pixels 11 and green sub-pixels 101 in second pixels 12 are arranged in a column, red sub-pixels 102 in the first pixels 11 and blue sub-pixels 103 in the second pixels 12 are arranged in a column.

In some other examples, in the row direction of the plurality of pixels 1, in a plurality of pixels 1 in a same row, a first pixel 11 and a second pixel 12 are alternately arranged. In this case, in the column direction of the plurality of pixels 1, the plurality of pixels 1 have a plurality of design manners.

For example, referring to FIG. 8, in the column direction of the plurality of pixels 1, in a plurality of pixels 1 in a same column, a first pixel 11 and a second pixel 12 are alternately arranged. And in a plurality of pixels 1 in a same column, green sub-pixels 101 in first pixels 11 and green sub-pixels 101 in second pixels 12 are arranged in a column, red sub-pixels 102 in the first pixels 11 and blue sub-pixels 103 in the second pixels 12 are arranged in a column. In this way, a color cast may be effectively reduced.

For example, referring to FIG. 9, in the row direction of the plurality of pixels 1, a first pixel column in which a plurality of first pixels 11 are arranged and a second pixel column in which a plurality of second pixels 12 are arranged are alternately arranged. Green sub-pixels 101 in the first pixels 11 of the first pixel column are arranged in a column, and red sub-pixels 102 in the first pixels 11 of the first pixel column are arranged in a column. Green sub-pixels 101 in the second pixels 12 of the second pixel column are arranged in a column, and blue sub-pixels 103 in the second pixels 12 of the second pixel column are arranged in a column.

In some other embodiments, in the plurality of pixels 1 included in the pixel structure 100, each pixel 1 includes a single green sub-pixel 101, a single red sub-pixel 102, and a single blue sub-pixel 3.

Figure 10:
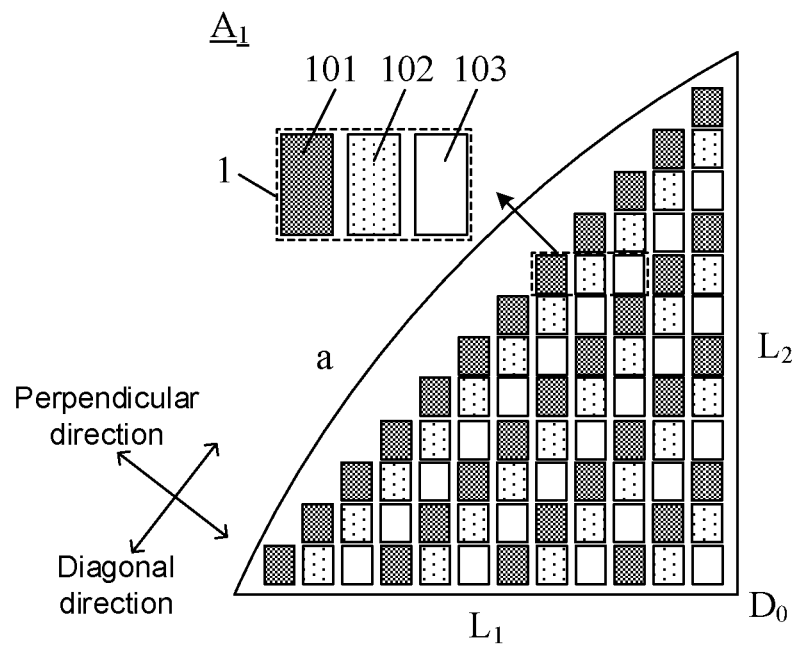
FIG. 10 is a schematic diagram of a part of yet another pixel structure disposed in a special-shaped display region, according to some embodiments of the present disclosure.
Figure 11:
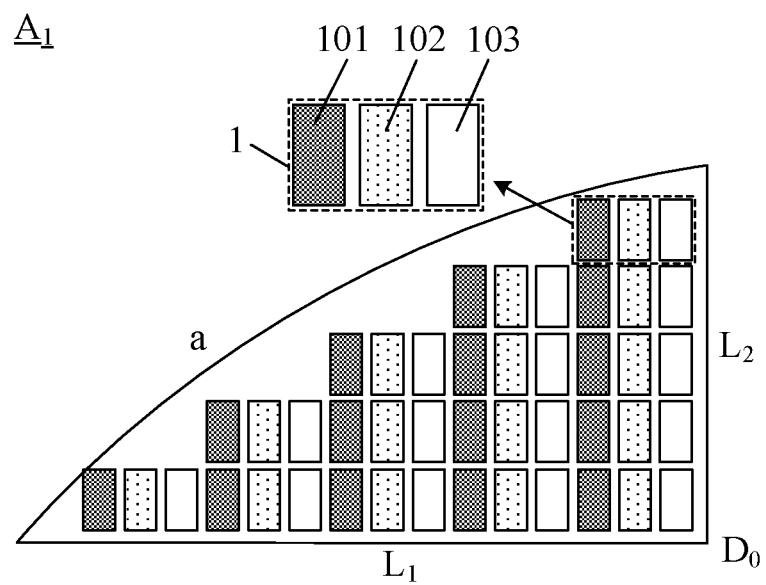
FIG. 11 is a schematic diagram of a part of yet another pixel structure disposed in a special-shaped display region, according to some embodiments of the present disclosure.

Herein, the plurality of pixels 1 have a plurality of design manners. Referring to FIGS. 10 and 11, the plurality of design manners of the plurality of pixels 1 are schematically described below.

In some examples, referring to FIG. 10, in the row direction of the plurality of pixels 1, in a plurality of pixels 1 in each row, the green sub-pixel 101, the red sub-pixel 102, and the blue sub-pixel 103 are periodically arranged. In the column direction of the plurality of pixels 1, in a plurality of pixels 1 in each column, the green sub-pixel 101, the red sub-pixel 102, and the blue sub-pixel 103 are periodically arranged. And, in a perpendicular direction of a diagonal direction of the plurality of pixels 1, a green sub-pixel diagonal column in which a plurality of green sub-pixels 101 are arranged, a red sub-pixel diagonal column in which a plurality of red sub-pixels 102 are arranged, and a blue sub-pixel diagonal column in which a plurality of blue sub-pixels 103 are arranged are periodically arranged. Herein, the term "diagonal direction" refers to a diagonal direction of each sub-pixel (the green sub-pixel 101, the red sub-pixel 102, or the blue sub-pixel 103).

In some other examples, referring to FIG. 11, in the row direction of the plurality of pixels 1, in a plurality of pixels 1 in each row, the green sub-pixel 101, the red sub-pixel 102, and the blue sub-pixel 103 are periodically arranged. In the row direction of the plurality of pixels 1, a green sub-pixel column in which a plurality of green sub-pixels 101 are arranged, a red sub-pixel column in which a plurality of red sub-pixels 102 are arranged, and a blue sub-pixel column in which a plurality of blue sub-pixels 103 are arranged are periodically arranged.

Figure 13:
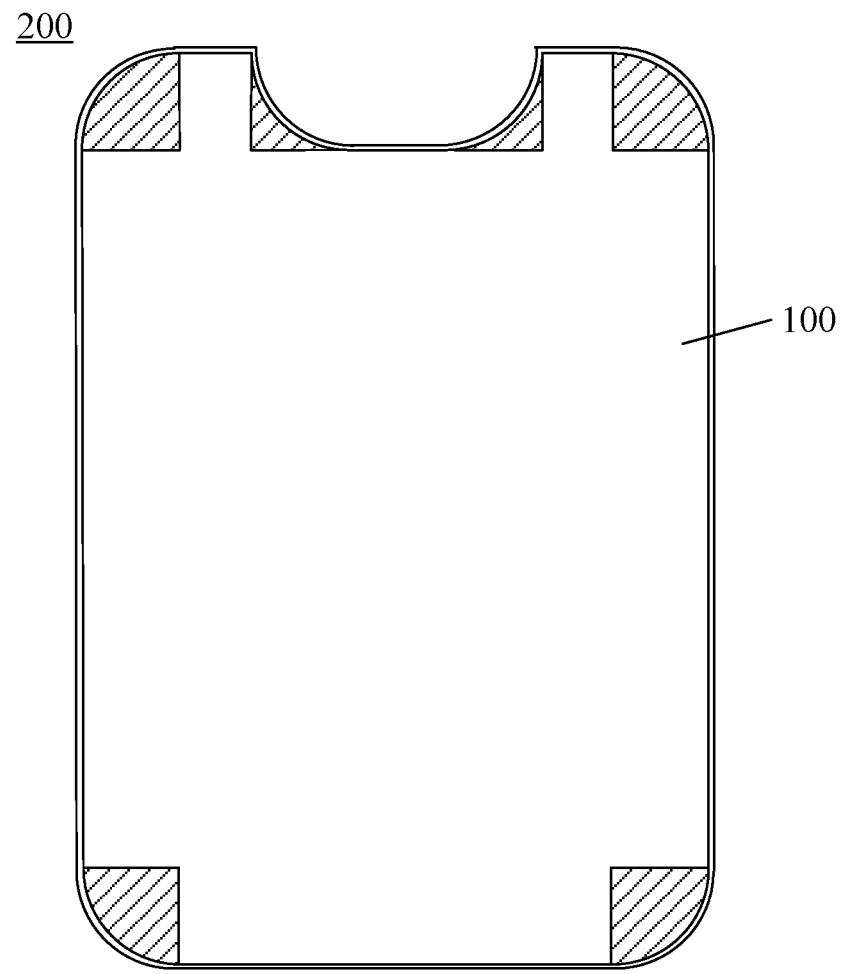
FIG. 13 is a schematic diagram of a display substrate, according to some embodiments of the present disclosure.

Some embodiments of the present disclosure provide a display substrate 200. Referring to FIG. 13, the display substrate 200 includes the pixel structure 100 provided by some embodiments described above. The pixel structure 100 in the display substrate 200 has the same advantages as the pixel structure 100 in some embodiments described above, and details are not described herein again.

Figure 14:
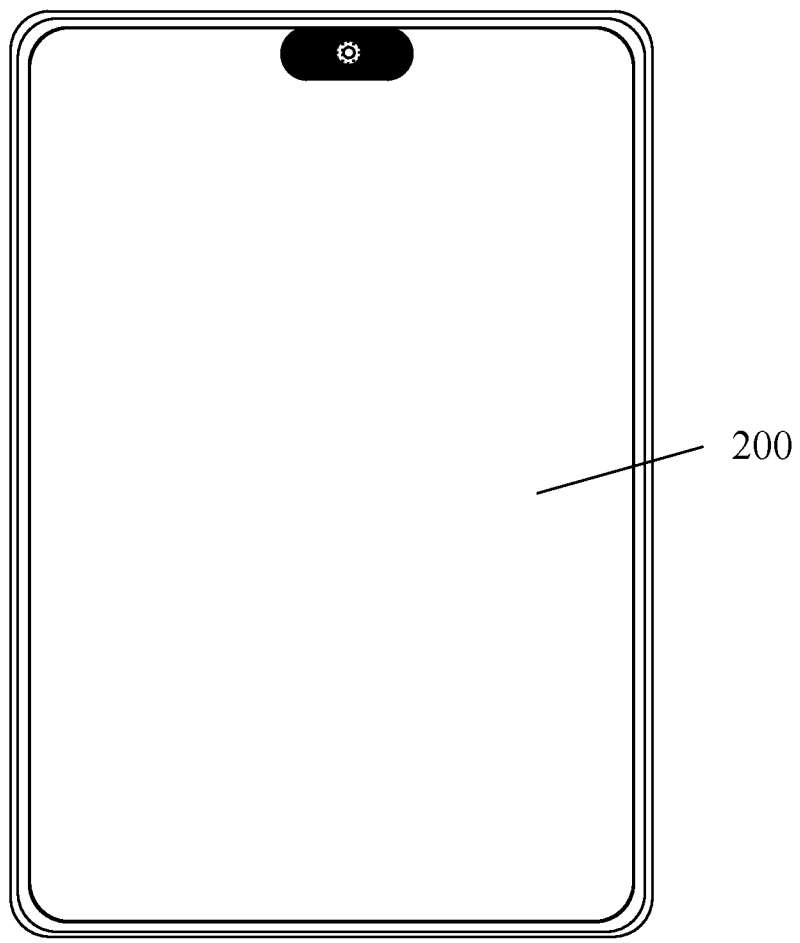
FIG. 14 is a schematic diagram of a display device, according to some embodiments of the present disclosure.

Some embodiments of the present disclosure provide a display device 300. Referring to FIG. 14, the display device 300 includes the display substrate 200 provided by some embodiments described above. The display substrate 200 in the display device 300 has the same advantages as the display substrate 200 in some embodiments described above, and details are not described herein again.

In some embodiments, the display device 300 is any product or component having a display function, such as an LCD panel, electronic paper, an OLED panel, a mobile phone, a tablet computer, a television, a display, a notebook computer, a digital photo frame, and a navigator.

In the description of the above embodiments, specific features, structures, materials or characteristics may be combined in any suitable manner in any one or more embodiments or examples.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A pixel structure, comprising a plurality of pixels, each of the plurality of pixels including at least one green sub-pixel and at least one other color sub-pixel; wherein
a display region determined by the plurality of pixels includes a main display region and at least one special-shaped display region, a boundary of each special-shaped display region includes an arc-shaped edge, a first straight edge, and a second straight edge that are connected in sequence;
the plurality of pixels include a plurality of pixels disposed in the main display region and a plurality of pixels disposed in the at least one special-shaped display region, and in each pixel disposed at a corresponding position of the arc-shaped edge, the at least one green sub-pixel is disposed at a side of the at least one other color sub-pixel proximate to the arc-shaped edge;

wherein the first straight edge is parallel to a row direction of the plurality of pixels, the second straight edge is parallel to a column direction of the plurality of pixels, an included angle between the first straight edge and the second straight edge is a right angle, and an intersection point of the first straight edge and the second straight edge is $D_0$; and an intersection point of the arc-shaped edge and an angular bisector of the right angle is $D_1$, and the arc-shaped edge is divided into a first arc-shaped segment and a second arc-shaped segment by the intersection point $D_1$;

an intersection point of the first arc-shaped segment and the first straight edge is $D_2$, and an intersection point of the first straight edge and a straight line that passes through the intersection point $D_1$ and is parallel to the column direction of the plurality of pixels is $D_3$; in a direction from the intersection point $D_2$ to the intersection point $D_3$, the first arc-shaped segment corresponds to N columns of pixels arranged in sequence, and N is an integer greater than or equal to 2; and an included angle between the second straight edge and a connecting line that is between a center of a pixel disposed at a corresponding position of the arc-shaped edge in a j-th column of pixels and the intersection point $D_0$ is $\alpha_j$, and j is an integer greater than 1 and less than or equal to N; and a difference value between a number of pixels of an end of the j-th column of pixels facing the first arc-shaped segment and a number of pixels of an end of a (j−1)-th column of pixels facing the first arc-shaped segment is equal to a value of $\tan \alpha_j$, which takes an integer value; and an intersection point of the second arc-shaped segment and the second straight edge is $D_4$, and an intersection point of the second straight edge and a straight line that passes through the intersection point $D_1$ and is parallel to the row direction of the plurality of pixels is $D_5$; in a direction from the intersection point $D_4$ to the intersection point $D_5$, the second arc-shaped segment corresponds to M rows of pixels arranged in sequence, and M is an integer greater than or equal to 2; and an included angle between the second straight edge and a connecting line that is between a center of a pixel at a corresponding position of the arc-shaped edge in an i-th row of pixels and the intersection point $D_0$ is $\alpha_i$, and i is an integer greater than 1 and less than or equal to M; and a difference value between a number of pixels of an end of the i-th row of pixels facing the second arc-shaped segment and a number of pixels of an end of an (i−1)-th row of pixels facing the second arc-shaped segment is equal to a reciprocal of a value of $\tan \alpha_i$, which takes an integer value.

2. The pixel structure according to claim 1, wherein in each pixel disposed at a corresponding position of the arc-shaped edge, a shape of the at least one green sub-pixel includes a first hypotenuse facing the arc-shaped edge, and there is an included angle between the first hypotenuse and a tangent line at a corresponding position of the arc-shaped edge.

3. The pixel structure according to claim 2, wherein the included angle between the first hypotenuse and the tangent line at the corresponding position of the arc-shaped edge is within a range from 0° to 45°, inclusive.

4. The pixel structure according to claim 2, wherein in each pixel disposed at a corresponding position of the arc-shaped edge, a shape of the at least one green sub-pixel includes a triangle, a pentagon, a trapezoid or a rhombus.

5. The pixel structure according to claim 2, wherein in each pixel disposed at a corresponding position of the arc-shaped edge, a shape of the at least one other color sub-pixel includes a second hypotenuse facing the arc-shaped edge, and there is an included angle between the second hypotenuse and a tangent line at a corresponding position of the arc-shaped edge.

6. The pixel structure according to claim 5, wherein the included angle between the second hypotenuse and the tangent line at the corresponding position of the arc-shaped edge is within a range from 0° to 45°, inclusive.

7. The pixel structure according to claim 5, wherein in each pixel disposed at a corresponding position of the arc-shaped edge, a shape of the at least one other color sub-pixel includes a triangle, a pentagon, a trapezoid or a rhombus.

8. The pixel structure according to claim 1, wherein an effective display area of each sub-pixel disposed in the at least one special-shaped display region is equal to an effective display area of each sub-pixel with a same color disposed in the main display region.

9. The pixel structure according to claim 1, wherein the plurality of pixels include a plurality of first pixels and a plurality of second pixels; in each of the plurality of first pixels, the at least one other color sub-pixel includes a single red sub-pixel; and in each of the plurality of second pixels, the at least one other color sub-pixel includes a single blue sub-pixel; wherein in a column direction of the plurality of pixels, a first pixel row in which a plurality of first pixels are arranged and a second pixel row in which a plurality of second pixels are arranged are alternately arranged; and in the column direction of the plurality of pixels, in a plurality of pixels in a same column, a first pixel and a second pixel are alternately arranged; and in a plurality of pixels in a same column, green sub-pixels in a plurality of first pixels and green sub-pixels in a plurality of second pixels are arranged in a column, and red sub-pixels in the plurality of first pixels and blue sub-pixels in the plurality of second pixels are arranged in a column.

10. The pixel structure according to claim 1, wherein the plurality of pixels include a plurality of first pixels and a plurality of second pixels; and in each of the plurality of first pixels, the at least one other color sub-pixel includes a single red sub-pixel, and in each of the plurality of second pixels, the at least one other color sub-pixel includes a single blue sub-pixel; wherein in a row direction of the plurality of pixels, in a plurality of pixels in a same row, a first pixel and a second pixel are alternately arranged; and in a column direction of the plurality of pixels, in a plurality of pixels in a same column, a first pixel and a second pixel are alternately arranged; and in a plurality of pixels in a same column, green sub-pixels in a plurality of first pixels and green sub-pixels in a plurality of second pixels are arranged in a column, and red sub-pixels in the plurality of first pixels and blue sub-pixels in the plurality of second pixels are arranged in a column.

11. The pixel structure according to claim 1, wherein in each of the plurality of pixels, the at least one green sub-pixel includes a single green sub-pixel, and the at least one other color sub-pixel includes a single red sub-pixel and a single blue sub-pixel; wherein in a row direction of the plurality of pixels, in a plurality of pixels in each row, a green sub-pixel, a red sub-pixel and a blue sub-pixel are periodically arranged;

in a column direction of the plurality of pixels, in a plurality of pixels in each column, a green sub-pixel, a red sub-pixel and a blue sub-pixel are periodically arranged; and in a perpendicular direction of a diagonal direction of the plurality of pixels, a green sub-pixel diagonal column in which a plurality of green sub-pixels are arranged, a red sub-pixel diagonal column in which a plurality of red sub-pixels are arranged, and a blue sub-pixel diagonal column in which a plurality of blue sub-pixels are arranged are periodically arranged.

12. The pixel structure according to claim 1, wherein in each of the plurality of pixels, the at least one green sub-pixel includes a single green sub-pixel, and the at least one other color sub-pixel includes a single red sub-pixel and a single blue sub-pixel; wherein in a row direction of the plurality of pixels, in a plurality of pixels in each row, a green sub-pixel, a red sub-pixel and a blue sub-pixel are periodically arranged;

in the row direction of the plurality of pixels, a green sub-pixel column in which a plurality of green sub-pixels are arranged, a red sub-pixel column in which a plurality of red sub-pixels are arranged, and a blue sub-pixel column in which a plurality of blue sub-pixels are arranged are periodically arranged.

13. A display substrate, comprising the pixel structure according to claim 1.

14. A display device, comprising the display substrate according to claim 13.

15. The pixel structure according to claim 1, wherein the plurality of pixels include a plurality of first pixels and a plurality of second pixels; and in each of the plurality of first pixels, the at least one other color sub-pixel includes a single red sub-pixel, and in each of the plurality of second pixels, the at least one other color sub-pixel includes a single blue sub-pixel; wherein in a row direction of the plurality of pixels, in a plurality of pixels in a same row, a first pixel and a second pixel are alternately arranged; and in the row direction of the plurality of pixels, a first pixel column in which a plurality of first pixels are arranged and a second pixel column in which a plurality of second pixels are arranged are alternately arranged; and green sub-pixels in the plurality of first pixels of the first pixel column are arranged in a column, red sub-pixels in the plurality of first pixels of the first pixel column are arranged in a column; and green sub-pixels in the plurality of second pixels of the second pixel column are arranged in a column, blue sub-pixels in the plurality of second pixels of the second pixel column are arranged in a column.

16. The pixel structure according to claim 1, wherein the included angle $\alpha_j$ is within a range from 45° to 90°, inclusive.

17. The pixel structure according to claim 1, wherein the included angle $\alpha_i$ is greater than or equal to 0°, and less than 45°.

* * * * *